(12) United States Patent
Yoshida et al.

(10) Patent No.: US 9,457,389 B2
(45) Date of Patent: Oct. 4, 2016

(54) ROLLED COPPER FOIL

(71) Applicants: FURUKAWA ELECTRIC CO., LTD., Tokyo (JP); FURUKAWA AUTOMOTIVE SYSTEMS INC., Shiga (JP)

(72) Inventors: Kazuo Yoshida, Toyko (JP); Naoko Aimiya, Tokyo (JP); Kazuhiko Asami, Shiga (JP); Ryuji Nishida, Shiga (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 0 days.

(21) Appl. No.: 14/273,525

(22) Filed: May 8, 2014

(65) Prior Publication Data

US 2014/0335372 A1    Nov. 13, 2014

Related U.S. Application Data

(63) Continuation of application No. PCT/JP2012/079300, filed on Nov. 12, 2012.

(30) Foreign Application Priority Data

Nov. 11, 2011  (JP) ................................. 2011-248097

(51) Int. Cl.
*B21C 37/00* (2006.01)
*B32B 15/00* (2006.01)
(Continued)

(52) U.S. Cl.
CPC . *B21B 1/40* (2013.01); *C22C 9/00* (2013.01); *C22F 1/00* (2013.01); *C22F 1/08* (2013.01);
(Continued)

(58) Field of Classification Search
USPC ........................................ 428/607, 688, 606
See application file for complete search history.

(56) References Cited

U.S. PATENT DOCUMENTS 5,334,346 A * 8/1994 Kim et al. .................... 420/485
6,093,499 A * 7/2000 Tomioka ....................... 428/606
(Continued)

FOREIGN PATENT DOCUMENTS

| JP | 2001062504 | * | 3/2001 |
| JP | 2001262296 | * | 9/2001 |

(Continued)

OTHER PUBLICATIONS

JP2001262296 Patent Abstract of Japan.*
(Continued)

*Primary Examiner* — Lauren R Colgan
(74) *Attorney, Agent, or Firm* — Amin, Turocy & Watson, LLP

(57) ABSTRACT

A rolled copper foil composed of crystal particles of copper or a copper alloy, wherein an average particle size of the crystal particles composing the outermost surface is not less than 0.2 μm and not greater than 6 μm; a ratio of the average particle size of the crystal particles composing the outermost surface to a thickness of the rolled copper foil is not less than 1% and not greater than 6%; and an intragranular distortion rate found by the following formula (1) when a cross-section perpendicular to a length direction of the rolled copper foil is analyzed by electron backscatter diffraction (EBSD) is not less than 0.5% and not greater than 10%:

Intragranular distortion rate (%)=(A)/(B)×100    Formula (1)

in the above formula (1), (A) represents the area of a region identified through image analysis to have an orientation difference of not less than 1 degree and not greater than 15 degrees, and (B) represents the area of a region identified through image analysis to have an orientation difference of not less than 0 degrees and not greater than 15 degrees.

5 Claims, 4 Drawing Sheets

(51) Int. Cl.
*B21B 1/40* (2006.01)
*C22F 1/00* (2006.01)
*C22F 1/08* (2006.01)
*H05K 1/09* (2006.01)
*C22C 9/00* (2006.01)
*B21B 3/00* (2006.01)

(52) U.S. Cl.
CPC ........... *H05K 1/09* (2013.01); *B21B 2003/005* (2013.01); *H05K 2201/0355* (2013.01); *H05K 2203/1105* (2013.01); *H05K 2203/1121* (2013.01); *Y10T 428/12431* (2015.01)

(56) References Cited

U.S. PATENT DOCUMENTS

| | | | |
|---|---|---|---|
| 6,372,061 B1* | 4/2002 | Hatano et al. | 148/432 |
| 8,221,897 B2* | 7/2012 | Muroga et al. | 428/606 |
| 2008/0099110 A1* | 5/2008 | Muroga et al. | 148/684 |
| 2009/0173414 A1* | 7/2009 | Muroga et al. | 148/432 |
| 2009/0229716 A1* | 9/2009 | Nakano et al. | 148/684 |
| 2010/0269959 A1* | 10/2010 | Gao et al. | 148/554 |
| 2010/0323214 A1* | 12/2010 | Muroga et al. | 428/606 |
| 2011/0311836 A1* | 12/2011 | Muroga et al. | 428/606 |

FOREIGN PATENT DOCUMENTS

| | | | |
|---|---|---|---|
| JP | 2005211948 | | 8/2005 |
| JP | 2009048819 | | 3/2009 |
| JP | 2009084593 | * | 4/2009 |
| JP | 2010150578 | | 7/2010 |
| WO | 2010001812 | | 1/2010 |

OTHER PUBLICATIONS

JP2001062504 Patent Abstract of japan.*
JP2001062504 English machine translation.*
JP2009084593 English machine translation.*
International Search Report for PCT Application Serial No. PCT/JP2012/079300, mailed Feb. 12, 2013, 2 pages.

* cited by examiner

ROLLED COPPER FOIL

CROSS-REFERENCE TO RELATED APPLICATIONS

This application is a continuation application of International Application No. PCT/JP2012/079300, filed Nov. 12, 2012, the disclosure of which is incorporated herein by reference in its entirety. Further, this application claims priority from Japanese Patent Application No. 2011-248097, filed Nov. 11, 2011, the disclosure of which is incorporated herein by reference in its entirety.

TECHNICAL FIELD

The present invention relates to rolled copper foil composed of crystal particles of copper or a copper alloy, and particularly relates to a rolled copper foil used in flexible flat cable and the like where flexion movement is repeated in automotive components and the like.

BACKGROUND TECHNOLOGY

Flexible flat cable (FFC), featuring a thin thickness and excellent flexibility, is used in a variety of uses for its high degree of freedom in implementation into electronic devices. It is widely used, for example, in a steering roll connector (SRC) which is a component of an airbag system in an automobile, in a folding part of a folding mobile telephone, in movable parts for digital cameras, printer heads, and the like, and in wiring and the like of movable parts in disk related devices such as a hard disk drive (HDD), digital versatile disc (DVD), compact disk (CD), and the like.

Note that rolled copper foil has been widely used conventionally in conductor parts for flexible flat cables.

Here, a rectangular conductor is disclosed in Japanese Unexamined Patent Application Publication No. 2009-048819 with a conductor composed of pure copper with a Cu concentration of 99.9% or more and an electrical conductivity of 95% or higher, the tensile strength being in a range greater than or equal to 350 MPa and less than or equal to 400 MPa. The rectangular conductor is used in automobiles, or the like, that can reach high temperature environments of 85° C. or higher, and achieves price reduction and maintains conductor strength.

Further, in Japanese Unexamined Patent Application Publication No. 2010-150578, a rolled copper foil after a final cold rolling process but prior to recrystallization annealing is disclosed wherein a diffraction peak exists due to a grain group exhibiting 4-fold symmetry residing in at least 90±5° each of β angles in a range where an α angle is within 40° to 50° as a positive pole figure result of {220} Cu surface diffraction of copper crystals by x-ray diffraction pole figure measurement as a reference for a rolled surface, and moreover, a diffraction peak exists due to a different grain group exhibiting 4-fold symmetry residing in 90±10° each of the β angles. Japanese Unexamined Patent Application Publication No. 2010-150578 provides a rolled copper foil having excellent flexing characteristics in response to the need for higher flexing characteristics relative to flexible wiring members such as flexible printed wiring boards and the like.

In Japanese Unexamined Patent Application Publication No. 2001-262296 a method of manufacturing a copper foil produced by subjecting an ingot of oxygen-free copper to hot rolling, then repeating cold rolling and annealing, and finishing with cold rolling to a thickness of 0.0050 mm or less is disclosed, wherein a cube texture is extremely developed by sequentially performing (1) cold rolling to 90% or more of the working ratio, (2) recrystallization annealing in a furnace at a temperature between 150 and 250° C. for 1 to 10 hours, or recrystallization annealing in a furnace at a temperature between 500° C. and 800° C. for 5 to 60 seconds, and (3) cold rolling to 5 to 40% of working ratio. Japanese Unexamined Patent Application Publication No. 2001-262296 also provides a copper foil favorable for use as a flexible wiring member such as a flexible printed circuit board and the like.

SUMMARY OF THE INVENTION

Problems to be Solved by the Invention

However, the conductor such as that in Japanese Unexamined Patent Application Publication No. 2009-048819 has a slight degree of work strain applied in the crystal grain, and thus is problematic in that it is susceptible to early breaking during flex fatigue under high temperature environments.

Further, Japanese Unexamined Patent Application Publication No. 2010-150578 has a problem in that a final rectangular conductor is produced through manufacturing by rolling in successive strips, and therefore costs are higher compared to methods for producing round wire by a drawing process and then rolling at a final stage.

Moreover, Japanese Unexamined Patent Application Publication No. 2001-262296 presents problems in that not only is there a high cost associated with rolling conditions and a high cost for repeating cold rolling and annealing, but the average grain size of between 5 μm and 30 μm is too large to satisfy the flexing characteristics and the strength required for an FFC.

In light of the above, an object of the present invention is to provide a rolled copper foil in which the generation of cracks is suppressed even under repeated flexion deformity.

Means for Resolving the Problems

The above problems for the present invention are resolved by the following means.

1. A rolled copper foil composed of crystal particles of copper or a copper alloy, wherein an average particle size of the crystal particles composing the outermost surface is not less than 0.2 μm and not greater than 6 μm; a ratio of the average particle size of the crystal particles composing the outermost surface to a thickness of the rolled copper foil is not less than 1% and not greater than 6%; and an intragranular distortion rate found by the following formula (1) when a cross-section perpendicular to a length direction of the rolled copper foil is analyzed by electron backscatter diffraction (EBSD) is not less than 0.5% and not greater than 10%.

$$\text{Intragranular distortion rate}(\%)=(A)/(B)\times 100 \quad \text{Formula (1)}$$

(In the above formula (1), (A) represents the area of a region identified through image analysis to have an orientation difference of not less than 1 degree and not greater than 15 degrees, and (B) represents the area of a region identified through image analysis to have an orientation difference of not less than 0 degrees and not greater than 15 degrees).

2. The rolled copper foil according to 1, wherein a ratio of the average particle size of the crystal particles composing the outermost surface to a thickness of the rolled copper foil is not less than 1% and not greater than 2%.

3. The rolled copper foil according to 1, wherein a ratio of the average particle size of the crystal particles composing the outermost surface to a thickness of the rolled copper foil is greater than 2% and less than 3%.

4. The rolled copper foil according to 1, wherein a ratio of the average particle size of the crystal particles composing the outermost surface to a thickness of the rolled copper foil is not less than 3% and not greater than 6%.

5. The rolled copper foil according to any one of 1 to 4, wherein a round wire type copper material is formed into a foil shape by rolling.

6. The rolled copper foil according to any one of 1 to 5, wherein a thickness of the rolled copper foil is not less than 0.02 mm and not greater than 0.1 mm.

Effect of the Invention

With the present invention, a rolled copper foil is provided in which the generation of cracks is suppressed even under repeated flexion deformity.

DETAILED DESCRIPTION OF THE INVENTION

Figure 1:
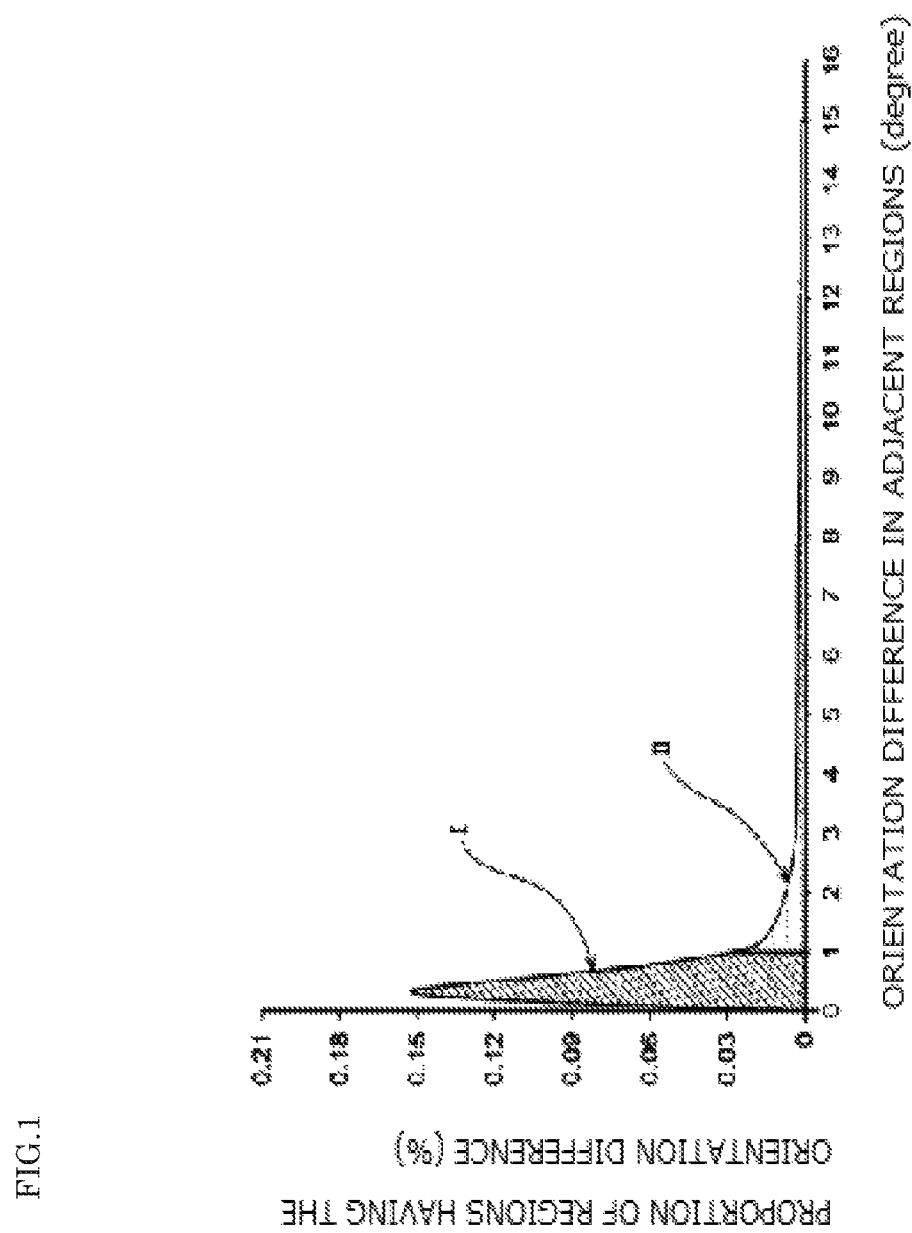
FIG. 1 is one example of a graph that plots a proportion of regions having an orientation difference in adjacent regions on the horizontal axis and regions having such orientation difference on the vertical axis based on EBSD analysis of the rolled copper foil.

The rolled copper foil according to the present invention is composed of crystal particles of copper or a copper alloy and satisfies the following requirements.

An average particle size of the crystal particles composing the outermost surface is not less than 0.2 µm and not greater than 6 µm A ratio of the average particle size of the crystal particles composing the outermost surface to a thickness of the rolled copper foil is not less than 1% and not greater than 6%

An intragranular distortion rate found by the following formula (1) when a cross-section perpendicular to a length direction of the rolled copper foil is analyzed by electron backscatter diffraction (EBSD) is not less than 0.5% and not greater than 10%

Intragranular distortion rate(%)=(A)/(B)×100    Formula (1)

(In the above formula (1), (A) represents the area of a region identified through image analysis to have an orientation difference of not less than 1 degree and not greater than 15 degrees, and (B) represents the area of a region identified through image analysis to have an orientation difference of not less than 0 degrees and not greater than 15 degrees).

The rolled copper foil according to the present invention as described above has an intragranular distortion rate of not less than 0.5% and not greater than 10%. The intragranular distortion rate, as expressed by formula (1), is a ratio of the area of a region with an orientation difference of not less than 1 degree and not greater than 15 degrees to the area of a region with an orientation difference of not less than 0 degrees and not greater than 15 degrees, and of the region with an orientation difference of not less than 0 degrees and not greater than 15 degrees recognized as intragranular distortion, a majority is occupied by an orientation difference of not less than 0 degrees and less than 1 degree, showing that a ratio for orientation difference of not less than 1 degree and not greater than 15 degrees is extremely small. In other words, this indicates that the crystals composing the rolled copper foil contain virtually no intragranular distortion.

Further, according to the above, an average particle size of the crystal particles composing the outermost surface is not less than 0.2 µm and not greater than 6 µm, and a ratio of the average particle size of the crystal particles composing the outermost surface to a thickness of the rolled copper foil is not less than 1% and not greater than 6%, so the particle size of the crystal particles of the outermost surface is extremely small.

The rolled copper foil according to the present invention that satisfies the above composition can suppress the generation of cracks even when under repeated flexion deformity, and as a result, can achieve a long life.

—Intragranular Distortion Rate—

In the present invention, an intragranular distortion rate, found by the following formula (1) when a cross-section perpendicular to a length direction of the rolled copper foil is analyzed by electron backscatter diffraction (EBSD), is not less than 0.5% and not greater than 10%. When the intragranular distortion rate exceeds 10%, early breakage becomes a problem due to coarsening of the crystal particles when undergoing repeated flexion deformity. On the other hand, when the intragranular distortion rate is below 0.5%, producibility is poor because controlling heat treatment is difficult.

The above intragranular distortion rate is measured according to the following method.

The rolled copper foil is cut in a direction perpendicular to the length direction and that cross section is analyzed using electron backscatter diffraction (EBSD). With EBSD analysis, the portion where the orientation difference in adjacent measured regions exceeds 15 degrees is identified as a crystal grain boundary, and that having an orientation difference up to 15 degrees is recognized as an intragranular distortion. However, the orientation difference measured between not less than 0 degrees and less than 1 degree is understood to be an unproblematic intragranular distortion. The reason is because distortions in this range normally do not disappear much even when undergoing annealing treatment and the like. Therefore, the distortion condition of the rolled copper foil can be evaluated by calculating the regions with an orientation difference not less than 1 degree and not greater than 15 degrees from among regions having an orientation difference from 0 degrees to 15 degrees.

Therefore, by extracting the portions of orientation difference from 0 degrees to 15 degrees, measuring the area of regions in the cross-section with an orientation difference of not less than 1 degree and not greater than 15 degrees and the area of regions with an orientation difference of not less than 0 degrees and not greater than 15 degrees, the intragranular distortion rate can be found using the formula (1).

The smaller the value of the intragranular distortion rate is, the smaller the intragranular distortion existing in the rolled copper foil is.

Figure 2:
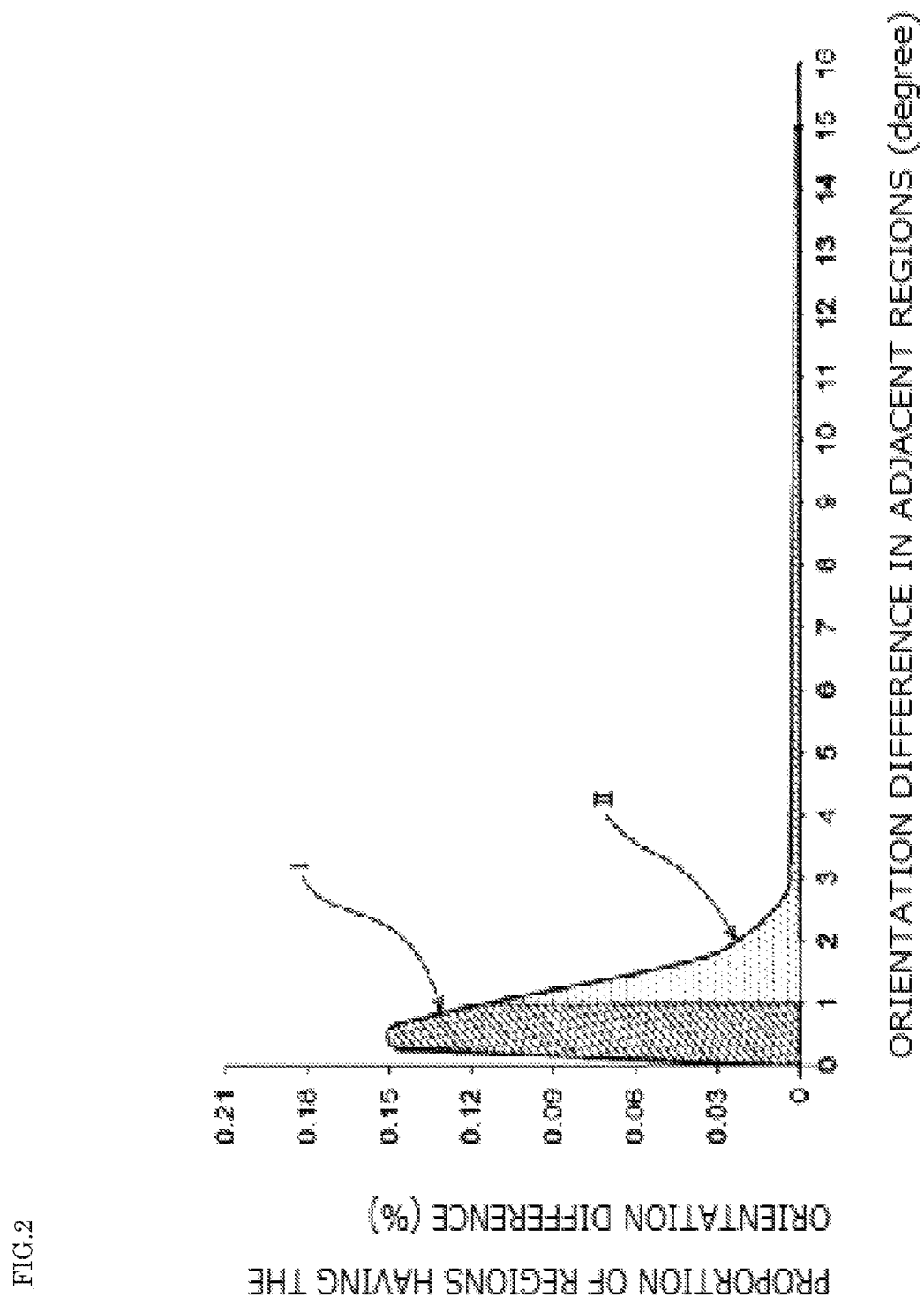
FIG. 2 is one example of a graph that plots a proportion of regions having an orientation difference in adjacent regions on the horizontal axis and regions having such orientation difference on the vertical axis based on EBSD analysis of the rolled copper foil.

FIG. 1 shows one example of an orientation difference of adjacent measurement regions and the existing proportion thereof. In FIG. 1, region I is an existing proportion of an orientation difference between not less than 0 degrees and less than 1 degree, and region II shows an existing proportion of an orientation difference between not less than 1 degree and not greater than 15 degrees. Accordingly, in the relationship in the above formula (1), (A) corresponds to region II and (B) corresponds to a region that is the sum of region I and region II. In other words, it is understood that the smaller region II expressed by (A) is, the smaller the intragranular distortion rate is. Although FIG. 2 also shows an example of an orientation difference of adjacent measurement regions and the existing proportion thereof, the region II in the example in FIG. 2 is larger than the example in FIG. 1. That is to say, a rolled copper foil in this state has a higher intragranular distortion rate than the example in FIG. 1 because (A) is larger in the above formula (1).

The inventors, in the course of their research, discovered that when the intragranular distortion rate satisfies a predetermined value, a rolled copper foil can be provided in which the generation of cracks can be suppressed even when undergoing repeated flexion deformity.

—Average Particle Size—

In the present invention, an average particle size of the crystal particles composing the outermost surface is not less than 0.2 µm and not greater than 6 µm, and a ratio of the average particle size of the crystal particles composing the outermost surface to a thickness of the rolled copper foil is not less than 1% and not greater than 6%. When the average particle size exceeds 6 µm or when the ratio of the average particle size exceeds 6%, the generation of cracks when undergoing repeated flexion deformity becomes problematic. On the other hand, when the average particle size is less than 0.2 µm or when the ratio of the average particle size is less than 1%, there is a problem in that the rolled copper foil has poor flexibility which makes wiring difficult.

Note that from the perspective of favorable bending, and from a point of view that the generation of cracking under repeated flexion deformity is more effectively suppressed, a ratio of the average particle size described above is better when smaller in the order of the following ranges: not less than 1% and not greater than 2%, greater than 2% and less than 3%, and not less than 3% and not greater than 6%.

At the same time, from the perspective of favorable flexing, and from a point of view that yield strength is lower and there is more flexibility the larger the ratio of the average particle size described above, a ratio of the average particle size is better when larger in the order of the following ranges: not less than 3% and not greater than 6%, greater than 2% and less than 3%, and not less than 1% and not greater than 2%.

The average particle size and the ratio of the average particle size are measured according to the following method.

A rolled copper foil is cut in a direction perpendicular to the length direction and a cross-section thereof is analyzed using EBSD. With EBSD analysis, the portion where the orientation difference exceeds 15 degrees is identified as a grain boundary and an image of the crystal grain is obtained. With this image, a number (K) of crystal grains composing the outermost surface in a specified width direction length (H) (at least not less than 40 µm) is found, and the width direction length (H) is divided by the number (K) of the crystal grains to get the average particle size of the crystal grains composing the outermost surface. Further dividing this value of the average particle size by the thickness of the rolled copper foil allows the ratio of the average particle size of crystal grains composing the outermost surface to the thickness of the rolled copper foil to be found.

—Method of Producing the Rolled Copper Foil—

In the production of the rolled copper foil according to the present invention, first, round wire type copper material is formed into a predetermined copper foil shape by rolling (rolling process), and thereafter, production is achieved by performing heat treatment (annealing) and cooling (annealing process). Note that, in the process for forming into the predetermined copper foil shape, rolling may be performed in multiple steps, and formation may be performed using methods in combination other than rolling. Further, heat treatment may be implemented at a step prior to forming the predetermined copper foil shape (prior to forming the final shape).

In addition to material composed of copper, material composed of a copper alloy may also be used as the copper material.

Examples of copper in the material composed of copper or the material composed of a copper alloy include tough pitch copper, oxygen-free copper, copper alloys containing a small amount of silver (Ag) or tin (Sn), and the like.

Note that what is important here is the heating temperature and the heating time during annealing.

With the rolled copper foil of the present invention, the ratio of the average particle size of crystal particles composing the outermost surface to the thickness of the rolled copper foil, and the intragranular distortion rate, are within the ranges described above. Examples of methods to control the intragranular distortion rate within the range include methods that adjust the heating temperature and heating time in the annealing process. Increasing the heating temperature and extending the heating time can further remove intragranular distortion, that is, the intragranular distortion rate tends to be reduced. However, if the heating temperature is too high or the heating time is too long, the particle size of the crystal grains become larger than desired resulting in adverse effects on bending, and therefore, appropriate conditions must be set according to the temper and wire diameter of the introduced wire prior to rolling and the sheet thickness and the like after rolling.

Further, examples of methods for controlling the ratio of the average particle size of the crystal grains to the thickness of the rolled copper foil to be within the range include methods for adjusting the heating temperature and the heating time in the annealing process. Decreasing the heating temperature or shortening the heating time maintains a small average particle size of the crystal particles, that is, the ratio of the average particle size of the crystal grains to the thickness of the rolled copper foil tends to be within the range. However, if the heating temperature is too low or the heating time is too short, intragranular distortion may remain having adverse effects on bending, and therefore, appropriate conditions must be set according to temper and wire diameter of the introduced wire prior to rolling and sheet thickness and the like after rolling.

Here, a description of one example of producing a rolled copper foil according to the present invention will be given with reference to figures.

Figure 3:
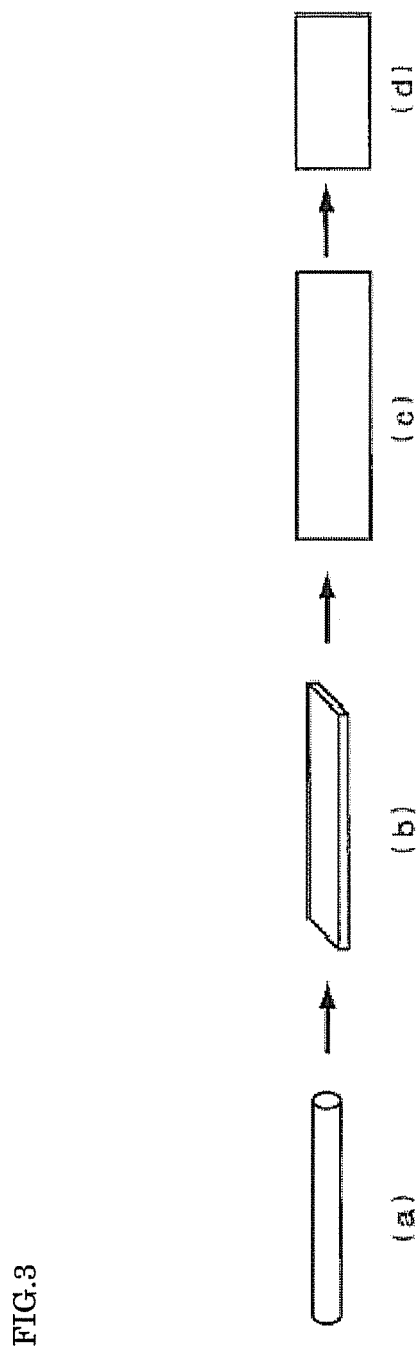
FIG. 3 is a schematic diagram for describing a production method of rolled copper foil according to an embodiment of the present invention.

FIG. 3 is a schematic diagram for describing a production method of rolled copper foil according to an embodiment of the present invention. Note that the shape of the rolled copper foil midway through manufacturing is schematically illustrated. Therefore, the present invention is not limited to the depicted shape.

—Rolling Process

As illustrated by step (a) in FIG. 3, first, a hard copper wire or a soft copper wire (round wire type) having a desired diameter (for example, Φ0.30 mm) is prepared. For example, the hard copper wire of the above diameter of Φ0.30 mm can be formed by drawing a soft copper wire having a larger diameter (for example, Φ2.6 mm). Further, after the soft copper wire having a larger diameter (for example, Φ2.6 mm) is drawn, the soft copper wire of the above diameter of Φ0.30 mm can be formed by conducting further heat treatment (for example, 300° C. for 2 hours).

Next, as illustrated by step (b) in FIG. 3, the hard copper wire having a desired diameter (for example, Φ0.30 mm) or the soft copper wire undergoes rolling to form a final foil shape (for example, a foil having a thickness of 0.080 mm by a width of 0.8 mm).

Examples of methods for rolling include methods that process by passing the copper wire between two or a plurality of rotating rollers. Note that the roller diameter, number of passes, the existence or absence of a lubricating agent, and the like can be appropriately regulated.

Note that rolling to form a final copper foil shape may be conducted in two or more steps, and further, a heating treatment may be implemented between the rolling steps when two or more rolling steps are performed.

—Annealing Process

Next, as illustrated by step (c) in FIG. 3, a heat treatment (annealing) is conducted on the final copper foil shape that has been formed. Preferred conditions for the heat treatment are a heating temperature within a range of not less than 200° C. and not higher than 1000° C. and a heating time within a range of not less than 0.01 seconds and not longer than 100 seconds (for example, conditions of a heating temperature of 400° C. and a heating time of 5 seconds may be conducted).

Note that examples of methods for carrying out the heat treatment (annealing) include methods such as heat treatments in which a salt bath is used, heat treatments using a batch furnace, current in-line annealing, and the like. However, methods for heat treatment are not limited to the above methods.

Figure 4:
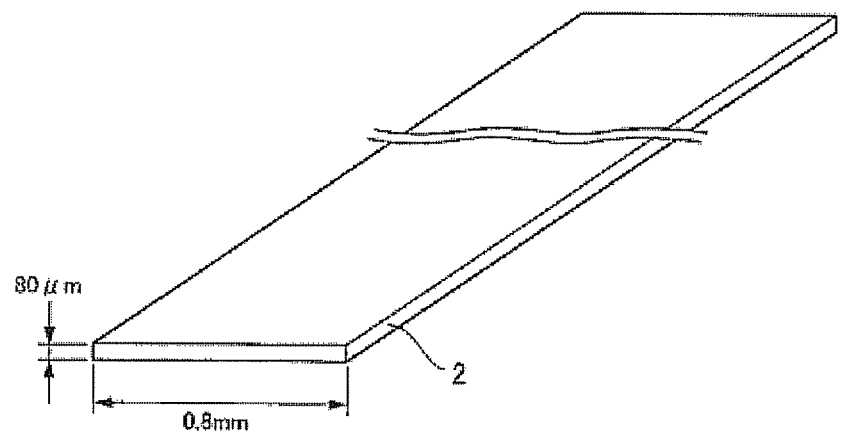
FIG. 4 is a schematic perspective view illustrating rolled copper foil according to an embodiment of the present invention.

Cooling thereafter (step (d)) produces the rolled copper foil 2 as illustrated in FIG. 4. Note that a preferred method for cooling is a method for rapid cooling such as cooling with water. Implementing rapid cooling such as cooling with water prevents coarsening of the crystal grain diameter.

Note that the thickness of the rolled copper foil according to the present invention is not particularly limited, but a range of not less than 0.02 mm and not greater than 0.1 mm is preferred.

—Use—

The rolled copper foil according to the present invention has excellent flexibility and excellent flex resistance and therefore has a high degree of freedom in implementation into electronic devices and the like and is thus suited for use as a flexible flat cable (FFC). For example, it can be suitably used in a steering roll connector (SRC) which is a configuring component of an airbag system in an automobile, or in a roof harness, door harness, floor harness, and the like.

Note that the disclosure of Japanese Patent Application No. 2011-248097 is, in its entirety, wholly incorporated into this specification by reference.

All documents, patent applications, and technical specifications described in this specification are incorporated into this specification by reference, and the incorporation of each document, patent application, and technical specification by reference is to the same extent as when specifically and individually described.

EXAMPLES

The rolled copper foil according to the present invention will be described hereinafter in examples, but the present invention is not in any way limited to these examples.

Working Example 1-1

As illustrated in FIG. 3, a soft copper wire of Φ2.6 mm was drawn to prepare a hard copper wire (round wire type) of Φ0.30 mm. Rolling was performed on the hard copper wire using a rolling machine (non-lubricated) having a roll with a diameter of Φ100 mm, to form a foil shape having a thickness of 0.080 mm by a width of 0.8 mm. Next, a heat treatment (annealing) was performed on the foil shape under conditions of 400° C. for 5 seconds using a salt bath, and after the heat treatment (annealing), rapid cooling by cooling with water was performed to obtain the rolled copper foil.

Using the method described above, the average particle size of crystal grains composing the outermost surface and the ratio of the average particle size to the thickness of the rolled copper foil were found, and the intragranular distortion rate was found using the formula (1) described above for use at the time of EBSD analysis of a cross-section perpendicular to the length direction of the rolled copper foil. The results are shown in Table 1.

Working Example 1-2

After the soft copper wire having a diameter of Φ2.6 mm was drawn in the example 1-1, a soft copper wire (round wire type) with a diameter of Φ0.30 mm was prepared by conducting a further heat treatment at 300° C. for 2 hours, and other than use of the soft copper wire in place of the hard copper wire (round wire type) with a diameter of Φ0.30 mm, a rolled copper foil was obtained according to the method described in example 1-1.

Comparative Example 1-1

A rolled copper foil was obtained using the method described in example 1-1 other than changing the temperature at the time of heat treatment (annealing) using a salt bath in the example 1-1 from 400° C. to 800° C.

Comparative Example 1-2

A rolled copper foil was obtained using the method described in example 1-1 other than not performing any heat treatment (annealing) using a salt bath and subsequent cooling with water in the example 1-2.

—Evaluation: Flex Resistance Test—

Figure 5:
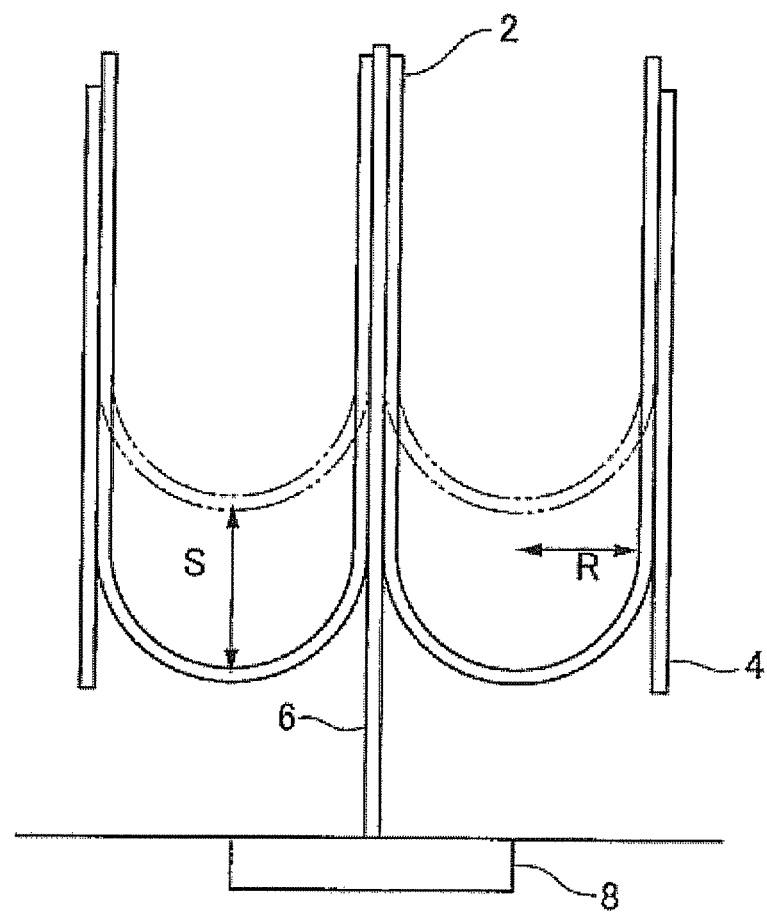
FIG. 5 is a schematic view illustrating the rolled copper foil fixed in a flex testing machine used in flex resistance testing in the examples.

Using an FPC flex testing machine (FT-2130) made by Ueshima Seisakusho shown in FIG. 5, the rolled copper foil 2 was secured in a sample fixing plate 4 and an operation plate 6, and flex testing was performed by operating the operation plate 6 by a motor 8. Note that, flex testing was repeated at a flexion R: 12.5 mm, stroke S: ±13 mm, environmental temperature: 85° C., rotational speed: 900 RPM, and break definition: initial resistance value+500Ω, until a break was verified.

Those evaluated at 5 million repetitions or more were designated as A, and those evaluated at less than 5 million repetitions were designated as B.

—Evaluation: Ease of Bending (Flexing)—

A tensile strength test was performed on the rolled copper foil and the yield strength was measured. Those having a low yield strength with excellent flexibility were designated as (Evaluation: A) and those having a high yield strength were designated as (Evaluation: B). As shown in the following Table 1, in example 1-1, 1-2, and comparative example 1-1, the ratio of average particle size of crystal grains composing the outermost surface to the thickness of the rolled copper foil was not too small and was considered to provide results for excellent flexing.

Comparative Example 2-1

A rolled copper foil was obtained using the method described in example 2-1 other than not performing any heat treatment (annealing) using a salt bath and subsequent cooling with water (that is, only interim annealing was performed) in the example 2-1.

—Evaluation: Flex Resistance Test—

Using an FPC flex testing machine (FT-2130) made by Ueshima Seisakusho shown in FIG. 5, the rolled copper foil 2 was secured in the sample fixing plate 4 and the operation plate 6, and flex testing was performed by operating the operation plate 6 by the motor 8. Note that, flex testing was repeated at a flexion R: 7.5 mm, stroke S: ±13 mm, environmental temperature: condition 1=85° C. and condition 2=20° C., rotational speed: 900 RPM, and break definition: initial resistance value+500Ω, until a break was verified. Note that condition 1 and condition 2 are temperature

TABLE 1

| | Copper Wire | | After Rolling | | Heat Treatment (Annealing) | | Top Surface Grain | Ratio of Particle Size to | Intragranular | Evaluation | |
|---|---|---|---|---|---|---|---|---|---|---|---|
| | Diameter [mm] | Temper | Thickness [mm] | Width [mm] | Temperature [° C.] | Time [sec] | Diameter [μm] | Thickness [%] | Distortion Rate [%] | Number of Flexes (Times) | Flexing Property |
| Working Example 1-1 | 0.3 | H | 0.08 | 0.8 | 400 | 5 | 1.6 | 2.0 | 3.2 | 10 million or more A | A |
| Working Example 1-2 | 0.3 | O | 0.08 | 0.8 | 400 | 5 | 2.0 | 2.5 | 1.4 | 10 million or more A | A |
| Comparative Example 1-1 | 0.3 | H | 0.08 | 0.8 | 800 | 5 | 8.2 | 10.3 | 1.0 | 2 million B | A |
| Comparative Example 1-2 | 0.3 | O | 0.08 | 0.8 | None | None | 1.2 | 1.5 | 77.0 | 50,000 B | B |

Working Example 2-1

As illustrated in FIG. 3, a soft copper wire of Φ2.6 mm was drawn to prepare a hard copper wire (round wire type) of Φ0.20 mm. Rolling was performed on the hard copper wire using a rolling machine (non-lubricated) having a roller with a diameter of Φ100 mm, to form a foil shape having a thickness of 0.035 mm by a width of 0.8 mm. Next, a heat treatment (annealing) was performed on the foil shape under conditions of 300° C. for 1 second using a salt bath, and after the heat treatment (annealing), rapid cooling by cooling with water was performed to obtain the rolled copper foil.

Using the method described above, the average particle size of crystal grains composing the outermost surface and the ratio of the average particle size to the thickness of the rolled copper foil were found, and the intragranular distortion rate was found using the formula (1) described above for use at the time of EBSD analysis of a cross-section orthogonal to the length direction of the rolled copper foil. The results are shown in Table 2.

Working Example 2-2 to Working Example 2-4

A rolled copper foil was obtained using the method described in example 2-1 other than changing the temperature and time at the time of heat treatment (annealing) using a salt bath in the example 2-1 to the conditions given in Table 2.

conditions in the testing chamber where the flex resistance test was performed. Condition 1 at high temperature is an accelerated test, and condition 2 indicates a test at room temperature conditions.

Those evaluated at 5 million repetitions or more were designated as Evaluation: A, and those evaluated at less than 5 million repetitions were designated as Evaluation: B.

—Evaluation: Ease of Bending (Flexing)—

A tensile strength test was performed on the rolled copper foil and the yield strength was measured, and those having a low yield strength were determined to have excellent flexibility. Those with a yield strength of 200 MPa or below were designated as Evaluation: A, and those having a yield strength that exceeded 200 MPa were designated as Evaluation: B.

As shown in the following Table 2, in Working Examples 2-1 to 2-4, the ratio of average particle size of crystal grains composing the outermost surface to the thickness of the rolled copper foil was not too small and was considered to provide results for excellent flexing.

—Evaluation: Tensile Strength and Elongation—

The tensile strength and elongation were measured by conducting a tensile test on the rolled copper foil.

(Measurement Conditions)

The tensile test when measuring the yield strength, the tensile strength, and the elongation was performed using a rectangular conductor of Table 2 on the test piece, and the test method was performed in compliance with JIS-Z2241 (1998).

TABLE 2

| | Copper Wire | | After Rolling | | Heat Treatment (Annealing) | | Outer Surface Grain Diameter [μm] | Ratio of Particle Size to Thickness [%] | Intragranular Distortion Rate [%] | Evaluation | | | | |
|---|---|---|---|---|---|---|---|---|---|---|---|---|---|---|
| | Diameter [mm] | Temper | Thickness [mm] | Width [mm] | Temperature [° C.] | Time [sec] | | | | Number of Flexes | | Flexing Property (Yield Strength) [MPa] | Tensile Strength [MPa] | Elongation [%] |
| | | | | | | | | | | Condition 1 (Times) | Condition 2 (Times) | | | |
| Working Example 2-1 | 0.2 | H | 0.035 | 0.8 | 300 | 1 | 0.96 | 2.7 | 7.8 | 5 million or more A | 5 million or more A | 135.6 A | 231.2 | 31.6 |
| Working Example 2-2 | 0.2 | H | 0.035 | 0.8 | 300 | 5 | 0.99 | 2.8 | 7.9 | 5 million or more A | 5 million or more A | 129.8 A | 234.0 | 30.8 |
| Working Example 2-3 | 0.2 | H | 0.035 | 0.8 | 500 | 1 | 1.32 | 3.8 | 5.0 | 5 million or more A | 5 million or more A | 95.0 A | 216.8 | 24.5 |
| Working Example 2-4 | 0.2 | H | 0.035 | 0.8 | 500 | 5 | 1.46 | 4.2 | 3.7 | 5 million or more A | 5 million or more A | 83.7 A | 208.3 | 21.4 |
| Comparative Example 2-1 | 0.2 | H | 0.035 | 0.8 | none | none | 0.71 | 2.0 | 41.8 | — | 3.27 million B | 384.0 B | 424 | 2.7 |

REFERENCE NUMERALS 2 rolled copper foil
4 sample fixing plate
6 operation plate
8 motor

The invention claimed is:

1. A rolled copper foil comprising crystal particles of copper or a copper alloy, the rolled copper foil comprising:
an average particle size of the crystal particles composing the outermost surface of the rolled copper foil of not less than 0.2 μm and not greater than 6 μm;
a ratio of the average particle size of the crystal particles composing the outermost surface of the rolled copper foil to a thickness of the rolled copper foil of not less than 1% and not greater than 6%;
and an intragranular distortion rate, found by the following formula (1) when a cross-section perpendicular to a length direction of the rolled copper foil is analyzed by electron backscatter diffraction (EBSD), of not less than 0.5% and not greater than 10%:

Intragranular distortion rate (%) =$(A)/(B) \times 100$   Formula (1)

in the formula (1), (A) represents an area of a region identified through image analysis to have an orientation difference of not less than 1 degree and not greater than 15 degrees, and (B) represents an area of a region identified through image analysis to have an orientation difference of not less than 0 degrees and not greater than 15 degrees, wherein
the rolled copper foil is formed by rolling a round wire copper material into a foil shape, and
the rolled copper foil is formed by performing a heat treatment on the round wire copper material in the foil shape under conditions from 300° C. to 500° C. and from 0.01 seconds to 100 seconds.

2. The rolled copper foil according to claim 1, wherein a ratio of the average particle size of the crystal particles composing the outermost surface of the rolled copper foil to a thickness of the rolled copper foil is not less than 1% and not greater than 2%.

3. The rolled copper foil according to claim 1, wherein a ratio of the average particle size of the crystal particles composing the outermost surface of the rolled copper foil to a thickness of the rolled copper foil is more than 2% and less than 3%.

4. The rolled copper foil according to claim 1, wherein a ratio of the average particle size of the crystal particles composing the outermost surface of the rolled copper foil to a thickness of the rolled copper foil is not less than 3% and not greater than 6%.

5. The rolled copper foil according to claim 1, wherein a thickness of the rolled copper foil is not less than 0.02 mm and not greater than 0.1 mm.

* * * * *